US012642020B2

(12) United States Patent
Schustereder et al.

(10) Patent No.: US 12,642,020 B2
(45) Date of Patent: May 26, 2026

(54) POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventors: Werner Schustereder, Villach (AT); Roman Baburske, Otterfing (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 735 days.

(21) Appl. No.: 17/941,052

(22) Filed: Sep. 9, 2022

(65) Prior Publication Data

US 2023/0087353 A1      Mar. 23, 2023

(30) Foreign Application Priority Data

Sep. 17, 2021    (DE) ......................... 102021124138.3

(51) Int. Cl.
H10P 32/10          (2026.01)
H10D 62/10          (2025.01)
(Continued)

(52) U.S. Cl.
CPC ......... H10P 32/171 (2026.01); H10D 62/124 (2025.01); H10D 62/133 (2025.01);
(Continued)

(58) Field of Classification Search
CPC ........... H01L 21/2253; H01L 21/26513; H01L 21/266; H01L 21/268; H01L 21/0273–0279; H01L 21/312–3128; H01L 21/02354; H01L 2021/60105–60127; H10D 62/124; H10D 62/133; H10D 62/393; H10K 71/233;
(Continued)

(56) References Cited

U.S. PATENT DOCUMENTS 5,401,666 A      3/1995   Tsukamoto
6,812,106 B1    11/2004   Xiang et al.
(Continued)

FOREIGN PATENT DOCUMENTS

CN          105244311 B   *   9/2018
EP            0082977 A1  *   7/1983
(Continued)

*Primary Examiner* — Shahed Ahmed
(74) *Attorney, Agent, or Firm* — Murphy, Bilak & Homiller, PLLC

(57) ABSTRACT

A method of forming a laterally varying dopant concentration profile of an electrically activated dopant in a power semiconductor device includes: providing a semiconductor body; implanting a dopant to form a doped region in the semiconductor body; providing, above the doped region, a mask layer having a first section and a second section, the first section having has a first thickness along a vertical direction and the second section having a second thickness along the vertical direction, the second thickness being different from the first thickness; and subjecting the doped region and both mask sections to a laser thermal annealing, LTA, processing step.

34 Claims, 4 Drawing Sheets

(51) Int. Cl.

| | | |
|---|---|---|
| *H10D 62/13* | (2025.01) | |
| *H10D 62/17* | (2025.01) | |
| *H10P 30/20* | (2026.01) | |
| *H10P 32/14* | (2026.01) | |

(52) U.S. Cl.
CPC ......... *H10D 62/393* (2025.01); *H10P 30/204* (2026.01); *H10P 30/21* (2026.01); *H10P 32/1406* (2026.01)

(58) Field of Classification Search
CPC ...... H10P 32/171; H10P 30/204; H10P 30/21; H10P 32/1406; H10P 76/00–4088; H10P 30/28; H10P 36/20
See application file for complete search history.

(56)                 References Cited

U.S. PATENT DOCUMENTS

| | | | |
|---|---|---|---|
| 9,558,948 B1 * | 1/2017 | Breymesser .......... | H01L 21/324 |
| 2008/0044988 A1 | 2/2008 | Zundel et al. | |
| 2009/0273772 A1 * | 11/2009 | Takai ........................ | G03F 1/24 |
| | | | 359/566 |
| 2011/0260221 A1 | 10/2011 | Mao et al. | |
| 2015/0255602 A1 | 9/2015 | Jangjian et al. | |
| 2016/0211261 A1 | 7/2016 | Liu et al. | |
| 2020/0335579 A1 * | 10/2020 | Schmidt .............. | H10D 12/481 |

FOREIGN PATENT DOCUMENTS

| | | | |
|---|---|---|---|
| EP | 0913860 B1 | 1/2008 | |
| EP | 1794816 B1 | 11/2015 | |

* cited by examiner (1)

(2)

POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device. In particular, this specification refers to embodiments of a power semiconductor device having a specific dopant profile in a doped semiconductor region and to corresponding embodiments of a method of producing a power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate or control electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

To provide for the designated characteristics of the power semiconductor device, the semiconductor body is configured with doped regions, such as, e.g., at a frontside, a source region, a body region, a body contact subregion, or, at a backside of the semiconductor body, emitter regions. As the relevant structure sizes continue to decrease, the dimensions of such doped regions have to correspondingly decrease.

It is accordingly desirable to provide local doped semiconductor regions with a clearly defined size and a specific dopant concentration profile.

SUMMARY

According to an embodiment, a method of forming a laterally varying dopant concentration profile of an electrically activated dopant in a power semiconductor device comprises: providing a semiconductor body; implanting a dopant to form a doped region in the semiconductor body; providing, above the doped region, a mask layer, wherein the mask layer has a first section and a second section, wherein the first section has a first thickness along a vertical direction and wherein the second section has a second thickness along the vertical direction, wherein the second thickness is different from the first thickness; and subjecting the doped region and both mask sections to a laser thermal annealing, LTA, processing step.

According to an embodiment, a method of forming a laterally varying dopant concentration profile of an electrically activated dopant in a power semiconductor device comprises: providing a semiconductor body; providing, at the semiconductor body, a mask layer, wherein the mask layer has a first section and a second section, wherein the first section has a first thickness along a vertical direction and wherein the second section has a second thickness along the vertical direction, wherein the second thickness is different from the first thickness; implanting a dopant to form a doped region in the semiconductor body; and subjecting the doped region and both mask sections to a laser thermal annealing, LTA, processing step.

According to an embodiment, a power semiconductor device comprises a semiconductor body with a surface and a first load terminal at the surface, wherein the semiconductor body includes an electrically activated region in a doped region, wherein the electrically activated region forms a part of the surface and exhibits a laterally varying dopant concentration profile having, in a change region, a dopant concentration gradient along a first lateral direction of at least $5*10^{21}$ cm$^{-3}$/50 nm.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals may designate corresponding parts. In the drawings.

DETAILED DESCRIPTION

Figure 1:
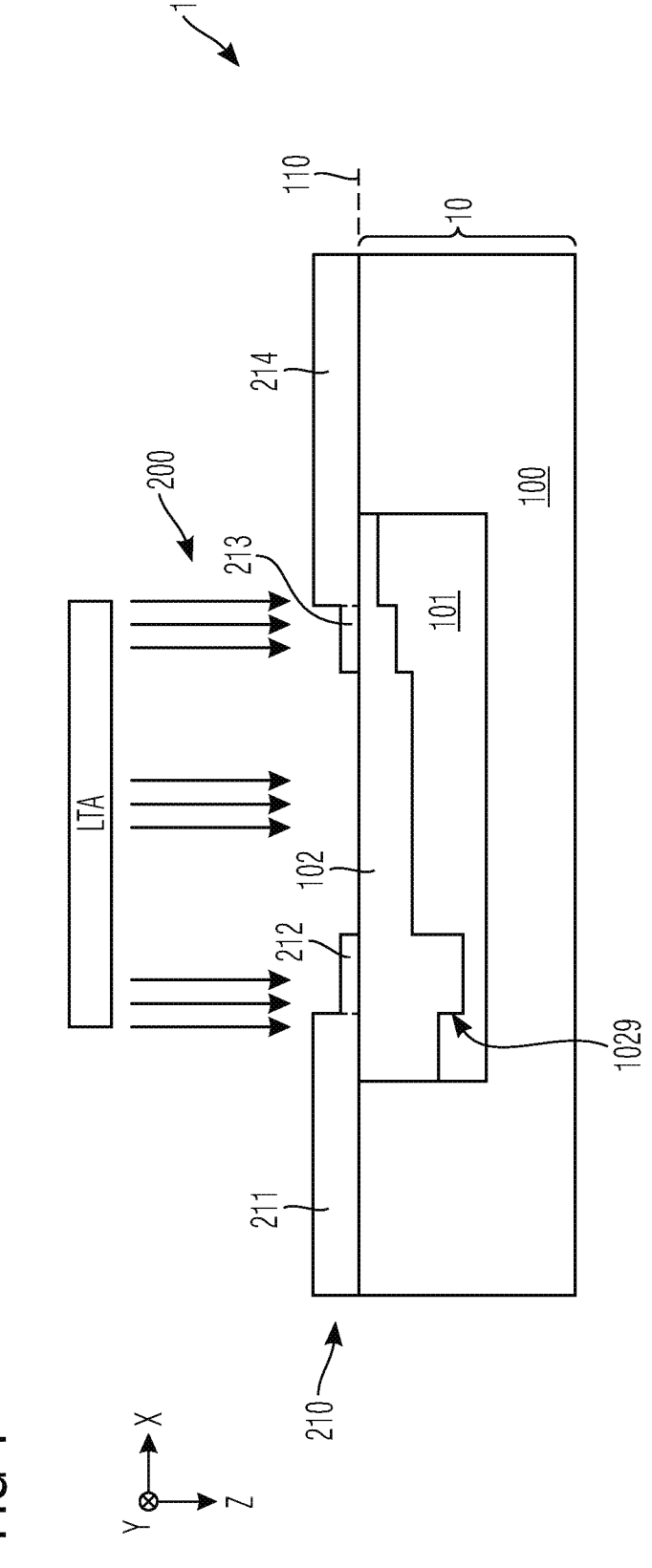
FIG. 1 schematically and exemplarily illustrates, based on a section of a vertical cross-section of a power semiconductor device, a method in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other does not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to a power semiconductor device, such as an IGBT, an RC IGBT, a MOSFET, a diode or derivatives thereof, e.g., a power semiconductor device to be used within a power converter or a power supply. Thus, in an embodiment, such power semiconductor device can be configured to carry a load current that is to be fed to a load and/or, respectively, that is provided by a power source. For example, the power semiconductor device may comprise a plurality of power semiconductor cells, such as monolithically integrated diode cells, derivatives of a monolithically integrated diode cell, monolithically integrated MOSFET or IGBT cells and/or derivatives thereof. Such diode/transistor cells may be integrated in a power semiconductor module. A plurality of such cells may constitute a cell field that is arranged within an active region of the power semiconductor device.

The term "power semiconductor device" as used in this specification intends to describe a power semiconductor device on a single chip with high voltage blocking and/or high current-carrying capabilities. In other words, embodiments of the power semiconductor device described herein are single chip power semiconductor devices configured for high current, typically in the Ampere range, e.g., up to several Ampere or up to several ten or hundred Ampere, and/or high voltages, typically 200 V and above, e.g., up to at least 400 V or even more, e.g., up to at least 3 kV, or even up to 10 kV or more.

For example, the power semiconductor device described below may be a single chip power semiconductor device configured to be employed as a power component in a low-, medium- and/or high voltage application. Several single chip power semiconductor device may be integrated in a module so as to form a power semiconductor device module, e.g., for installation and use in a low-, medium- and/or high voltage application, such as a major home appliance, a general purpose drive, an electric-drive train, a servo drive, a traction, a (higher) power transmission facilities, etc.

For example, the term "power semiconductor device" as used in this specification is not directed to a logic semiconductor device used for, e.g., storing data, computing data and/or other types of semiconductor-based data processing.

Each of FIGS. 1 to 4 schematically and exemplarily illustrates a section of a vertical cross-section of embodiments of a power semiconductor device 1. Based on the illustration in FIG. 1, embodiments of a method of producing such power semiconductor devices 1 shall first be described.

In an embodiment, a method of forming a laterally varying dopant concentration profile of an electrically activated dopant in a power semiconductor device 1 is presented. The method comprises the step of providing a semiconductor body 10 and the step of implanting a dopant to form a doped region 101 in the semiconductor body 10. Next, the step of providing, above the doped region 101, a mask layer 210 is carried out, wherein the mask layer 210 has a first section 211 and a second section 212. The first section 211 has a first thickness along the vertical direction Z and the second section 212 has a second thickness along the vertical direction Z, wherein the second thickness is different from the first thickness. Then, the step of subjecting the doped region 101 and both mask sections 211 and 212 to a laser thermal annealing, LTA, processing step.

Still referring to FIG. 1, in another embodiment, the order of processing steps may be different. For example, after proving the semiconductor body 10 (and before implanting), the mask layer 210 is provided. Then, the step of implanting the dopant to form the doped region 101 in the semiconductor body 10 is carried out. Thereafter, the step of subjecting the doped region 101 and both mask sections 211 and

212 to the LTA processing step is carried out. Then, mask layer 210 is already used during implantation, yielding a self-aligned process stage.

In another embodiment, the embodiments described in the two preceding paragraphs are combined with each other. For example, after a first implantation processing step, the mask layer 210 is provided. Then, a second implantation processing step is carried out. Thereafter, the LTA processing step may be carried out.

FIG. 1 illustrates that the above-described processing steps are directed to a frontside 110 of the semiconductor body 10. However, the above-described processing steps may additionally or alternatively be directed to a backside 120 of the semiconductor body 10, which will be described further below.

The mask layer 210 may comprise a third section 213 and a fourth section 214, wherein the third section 213 and the fourth section 214 may or may not exhibit different thicknesses along the vertical direction Z. In the schematic representation of FIG. 1, the third section 213 is illustrated as having the same thickness has the second section 212, and the fourth section 214 is illustrated as having the same thickness as the first section 211. At the same time, the vertical extension of an electrically activated region 102 (cf. description further below) below the third and fourth sections 213, 214 may be different from the vertical extension of the electrically activated region 102 below the first and second sections 211, 212, e.g., due to a difference of the reflectance of first and/or second section(s) 211, 212 and the reflectance of the third and/or fourth section(s) 213, 214. Such differences in reflectance may be achieved based on using a first material for forming sections 211, 212 and another material for forming sections 213, 214. Or, the same material may be used and the third and/or fourth section(s) 213, 214 may be provided with a respective thickness different from the thickness of the first and/or the second section 211, 212.

In an embodiment, each section 211 to 214 of the mask layer 214 is made out of the same material (example of which being described below).

The second mask section 212 of the mask layer 210 may adjoin the first section 211. Likewise, the third mask section 213 of the mask layer 210 may adjoin the fourth section 214. The first and second mask sections 211, 212 of the mask layer 210 may form a contiguous first part (i.e., a monolithic first part) of the mask layer 210, and third and fourth mask sections 213, 214 of the mask layer 210 may form a contiguous second part (i.e., a monolithic second part) of the mask layer 210. The first part of the mask layer 210 may be separated from the second part of the mask layer 210 such that a mask opening is established, as illustrated in FIG. 1.

The mask layer 210, e.g., the first and second mask sections 211, 212 and, if present, also the third and fourth sections 213, 214, can be made of a mask material including at least one of silicon oxide, $SiO_2$, silicon nitride, $Si_3N_4$, and amorphous silicon.

For example, the first mask layer section 211 has a first reflectance different from a second reflectance of the second mask layer section 212. Also, the third mask layer section 213 can have a third reflectance different from a fourth reflectance of the fourth mask layer section 214. For example, the first reflectance is above 50%, and the second reflectance is below 35%. Both the third and fourth reflectance can also be above 50%. For example, the first and fourth mask sections 211, 214 can be equally configured in terms of reflectance and/or thickness, and the second and third mask sections 212, 213 can be equally configured in terms of reflectance and/or thickness. Depending on the designated configuration of the doped semiconductor region 101, a different approach, e.g., where the third and fourth mask sections 213 and 214 are configured differently as compared to the first and second mask sections 211 and 212 may also be chosen.

The configuration of the mask layer 210 and the LTA processing step 200 may be adapted with respect to each other. For example, said first reflectance and said second reflectance are present at a specific wavelength of a laser light emitted during the LTA processing step 200. Also, said third reflectance and said fourth reflectance can be present at a specific wavelength of a laser light emitted during the LTA processing step 200. Further, the first thickness and the second thickness can be chosen in dependence of the wavelength of the laser light emitted during the LTA processing step 200. Also, the third thickness and the fourth thickness can be chosen in dependence of the wavelength of the laser light emitted during the LTA processing step 200.

In an embodiment, the laser light emitted during the LTA processing step 200 has a wavelength in the range of 150 nm to 1100 nm. Different lasers may be employed, e.g., an ArF Excimer Laser operating at, e.g., 193 nm wavelength, or an XeF Excimer Laser operating at, e.g., 308 nm wavelength, or an Nd:YAG Laser operating at, e.g., 1064 nm wavelength.

The LTA processing step 200 may consist in a single laser shot, e.g., a single laser shot of a duration within the range of 1 ns to 1000 ns, e.g., within the range of 20 ns to 200 ns.

In an embodiment, the first mask layer section 211 acts as a laser light reflector (not illustrated) and the second mask layer section 212 acts as a laser light absorber (e.g., as an anti-reflex layer). For example, based on exhibiting a reflectance higher than 50%, the first mask layer section 211 acts as a laser light reflector. For example, based on based on exhibiting a reflectance lower than 35%, the first mask layer section 211 acts as a laser light absorber. In another embodiment, as illustrated in FIG. 1, both mask layer sections 211 and 212 may act as laser light absorbers.

In an embodiment, the laser energy coupled into the doped region 101 may vary such that the doped region 102 either exhibits a short phase of melting or remains in solid state configuration.

For example, the corresponding laser energy density threshold for substrate melting is mainly determined by the combination of substrate material and configuration, amount of crystal damage, properties of surface layers, laser process conditions (e.g., laser wavelength, pulse duration, repetition frequency) and external wafer heating. Depending on the time the doped region 102 exceeds a threshold temperature required for dopant activation, the ratio of electrically activated concentration vs. implanted dopants concentration can be adjusted, e.g., such that at least 5% or at least 10% or at least 30% are achieved (i.e., at least 5% or at least 30% of the implanted dopants may be electrically activated).

For example, depending on the configuration of the respective mask section, the laser radiation may either be melting or non-melting. Further, since the mask layer 210 may locally act as anti-reflex layer, i.e., absorber layer, the duration and/or the energy of the LTA processing step 200 may be reduced. Thus, based on the configuration of the LTA processing step 200 and based on the configuration of the mask layer 210, a portion of the doped region 101 may be electrically activated whereas another portion directly adjacent thereto is not electrically activated or at least electrically activated to a lesser extent.

The LTA processing step 200 may be carried out to electrically activate the implanted dopant at least partially, thereby forming an electrically activated region 102 in the doped region 101. As exemplary illustrated in FIG. 1, the different configuration of the mask sections 211 to 214 is accordingly observed in the configuration of the electrically activated region 102: The second mask section 212 exhibits the lowest reflectance, the first mask section 211 the second lowest reflectance; these two sections 211 and 212 rather act as anti-reflex layers, which accordingly yields the longest vertical extensions of the electrically activated region 102 below these sections 211 and 212. In particular, due to the configuration of the first and second mask sections 211 and 212, the vertical extension of the electrically activated region 102 below these sections 211 and 212 is greater as compared to the portion of the electrically activated region 102 below the mask opening. Then, further along the first lateral direction X, the vertical extension of the electrically activated region 102 below the mask sections 213 and 214 is even smaller as compared to the portion of the electrically activated region 102 below the mask opening, as the mask sections 213 and 214 may exhibit a comparatively high degree of reflectance and, e.g., act as a Bragg reflector layer.

From the preceding description of an exemplary embodiment, it becomes clear that based on the laterally varying configuration of the mask layer 210, a correspondingly laterally varying dopant concentration profile may be provided in the electrically activated region 102 below the mask layer 210. For example, the electrically activated region 102 exhibits, in a change region 1029 corresponding to a vertical projection of the transition between the first mask section 211 and the second mask section 212, a dopant concentration gradient along a first lateral direction X of at least $5*10^{21}$ $cm^{-3}$/50 nm. This dopant concentration gradient refers to the electrically activated dopants in the electrically activated region 102.

Therefore, in accordance with embodiments described herein, it is possible to generate, in close proximity to a surface of the semiconductor body 10, at the frontside 110 and/or the backside 120, a shallow electrically activated region 102 exhibiting a laterally strongly varying dopant concentration profile.

The implanted dopant for example includes one of boron-fluorine ($BF_2$), boron (B), gallium (Ga), aluminum (Al), nitrogen (N), arsenic (As), phosphorus (P) and antimony (Sb). The dopant can be implanted with an energy in the range of 10 keV to 1000 keV, or depending on the designated configuration, with even lower or even higher energies. For example, a maximum concentration of the implanted dopant is situated in the range of 10 nm to 1000 nm.

The method may further comprise the step of implanting a non-dopant, e.g., a heavy metal (e.g., platinum (Pt), palladium (Pd), gold (Au)), into the doped region 101. In this embodiment, the region that came into being based on subjecting the doped region 101 to the LTA processing step 200 may act as a recombination zone in the semiconductor body 10.

Forming the mask layer 210 can include depositing the mask material, e.g., based on a plasma assisted deposition; carrying out a lithographic processing step; and carrying out an etch processing step. Thereby, the differently configured mask sections 211 to 214 may be formed. The forming of the mask layer 210 may be carried out prior to or after the implanting of the dopant(s) or, respectively, the formation of the doped region 101. In the latter case, the mask layer 210 may also be used as a mask for the formation of the doped region 101, e.g. resulting in a masked implantation process.

The above-described embodiments may be employed to form various power semiconductor devices.

Figure 2:
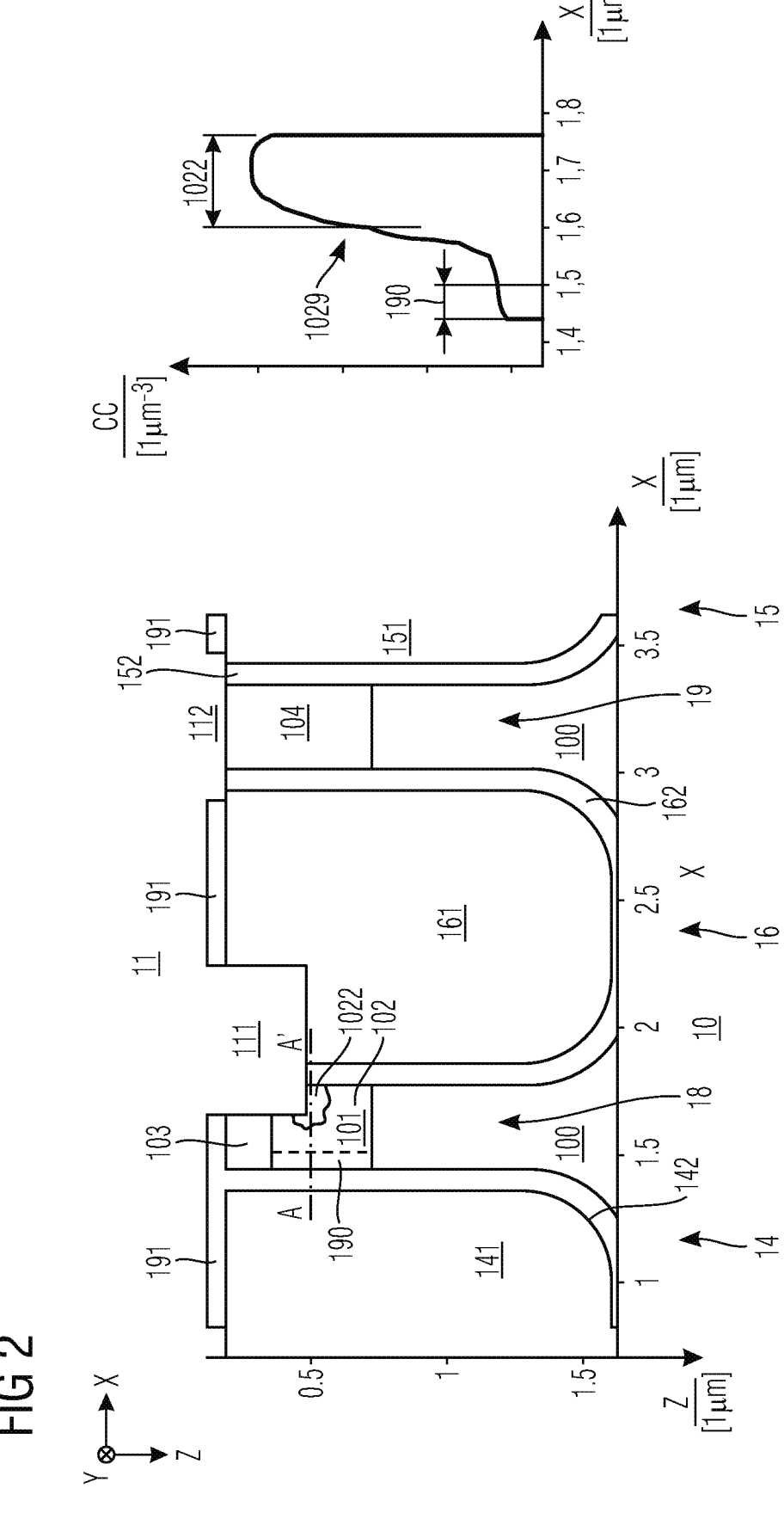
FIG. 2 schematically and exemplarily illustrates a section of a vertical cross-section of a power semiconductor device in accordance with one or more embodiments.

Referring to FIG. 2, a power semiconductor device 1 has a semiconductor body 10 and, coupled thereto, a first load terminal 11 and a second load terminal (not illustrated in FIG. 2). The power semiconductor device 1 is configured for conducting a load current between the first load terminal 11 and the second load terminal. The first load terminal 11 may be arranged at a first side 110 of the semiconductor body 10, wherein the first side 110 may be a frontside. The second load terminal may also be arranged at a first side 110 of the semiconductor body 10, or, alternatively, as e.g. illustrated in FIGS. 3 and 4, at a second side 120 of the semiconductor body 10, wherein the second side 120 may be a backside.

The semiconductor body 10 can exhibit any configuration, such as a diode configuration, a MOSFET configuration, an IGBT configuration or a derivate thereof. According to the configuration, the semiconductor body 10 may comprise several doped regions. These configurations are principally known to the skilled person and will hence not described here in more detail.

For example, FIG. 2 illustrates a trench-based MOS structure at the frontside. Such structure may, e.g., belong to an IGBT, an RC IGBT or a MOSFET or the like. A contact plug 111 extends from the first load terminal 11, e.g., a source terminal or an emitter terminal, along the vertical direction Z to electrically contact both a source trench electrode 161 and a source region 103 and a body contact subregion 1022 in a mesa 18. The mesa 18 is laterally confined by a control trench 14 housing a control trench electrode 141 and a source trench 16 housing the source trench electrode 161. Both trench electrodes 141 and 161 are separated from the semiconductor body 10 by respective trench insulators 142, 162. An insulation layer 191 separates the trench electrodes 141 and 161 from the first load terminal 11. A body region 102 is of the second conductivity type and isolates the source region 103 of the first conductivity type from a portion of the drift region 100 of the first conductivity type. The control electrode 141 is configured to induce, upon being exposed to a corresponding control signal (e.g., a gate-source-voltage) an inversion channel in a channel region 190 of the body region 102.

A further mesa 19 may be formed between the source trench and another trench 15 housing another trench electrode 151 separated from the semiconductor body 10 by trench insulators 152. For example, in the further mesa 14, no source region is provided, but a region 104 of the second conductivity type and electrically connected to the first load terminal 11 based on a contact 112.

To ensure a good electrical connection between the body region 102 and the contact plug 111, said body contact subregion 1022 can be formed in the body region 102. The body contact subregion 1022 exhibits a much higher dopant concentration as compared to the remainder of the body region 102. Simultaneously, it is ensured that the body contact subregion 1022 is sufficiently displaced from the channel region 190, namely based on correspondingly configured dopant concentration profile that laterally varies along the first lateral direction X, e.g., as schematically illustrated in the right part of FIG. 2. The graph illustrated there represents the dopant concentration in the first lateral direction X along line AA'. For example, the maximum dopant concentration of the portion of the body region 102 forming the channel region 190 amounts to at least $1*10^{17}$ $cm^{-3}$ to $1*10^{18}$ $cm^3$. The dopant concentration of the portion of the body region 102 forming the body contact subregion 1022 may amount to more than $2*10^{18}$ $cm^{-3}$.

Thus, the body region 102 may be configured with said change region 1029 described above. That is, body region 102 may have been formed in accordance with an embodiment of the processing methods described above; accordingly, the body region 102 can correspond to the electrically activated region 102 described above. Further, the body region 102 is part of a doped region 101, and the doped region 101 forms a part of the surface at the frontside 110 of the semiconductor body 10, e.g., where the contact plug 111 contacts the body contact subregion 1022.

The dopant of the doped region 101 may include one of boron-fluorine, boron, gallium, aluminum, nitrogen, arsenic, phosphorus and antimony. Such material may hence also be observed in the body region 102 (and in the body contact subregion 1022).

Based on the preceding description, it is clear that the electrically activated region 102 having such change region 1029 may be provided in diverse power semiconductor devices.

Figure 3:
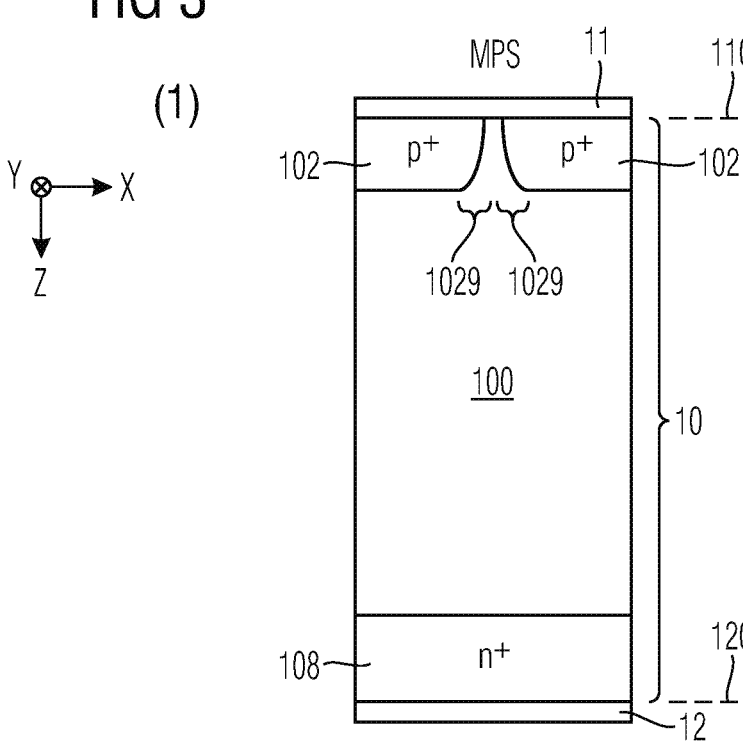
FIG. 3 schematically and exemplarily illustrates a section of a vertical cross-section of a power semiconductor device in accordance with some embodiments.
Figure 3:
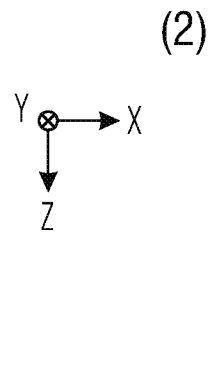
Figure 3:
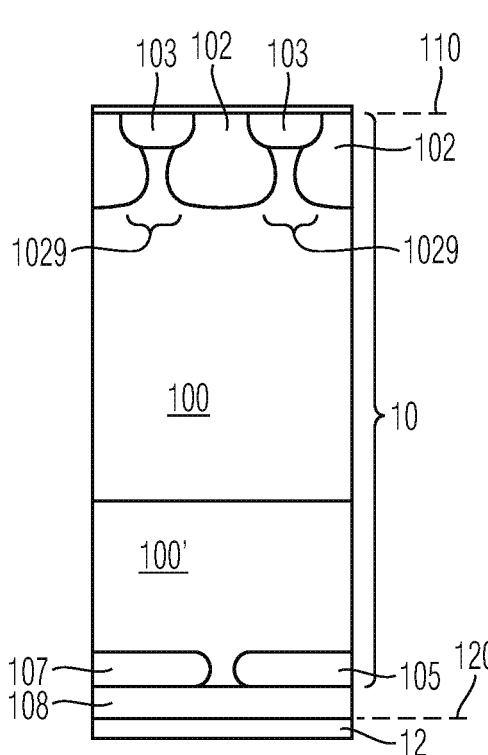

For example, regarding FIG. 3, two examples (1) and (2) of a diode are illustrated. The first example (1) shows a merged-PIN-Schottky, MPS, configuration of a diode. There, a Schottky contact is formed at a transition between the first load terminal 11 and the drift region 100. Adjacent to said transition, two electrically activated regions 102 are provided, both exhibiting a respective change region 1029. There, the electrically activated regions 102 may form body regions of the second conductivity type. The drift region 100 of the first conductivity type extends along the vertical direction Z until adjoining region 108, e.g., an emitter region of the first conductivity type. The region 108 is electrically connected to the second load terminal 12 at the backside 120 and exhibits a higher dopant concentration than the drift region 100. The first load terminal 11 may be an anode terminal, and the second load terminal 12 may be a cathode terminal.

The second example (2) of a diode illustrated in FIG. 3 shows a so-called IDEE configuration (Inverse Injection Dependency of the Emitter Efficiency). There, at the backside 120, above the region 108 (e.g., an emitter region of the first conductivity type), regions 107 of the second conductivity type are formed space apart from each other to allow for a portion of the region 100' to adjoin the field stop region 108. Region 100' is of the same conductivity type as the drift region 100, but exhibits a higher dopant concentration. At the frontside 120, the electrically activated regions 102 may form body regions of the second conductivity type electrically connected to the first load terminal 11. Highly doped subregions 103 of the first conductivity type are also electrically connected to the first load terminal 11 and separate, as illustrated, the electrically activated regions 102 from each other.

Figure 4:
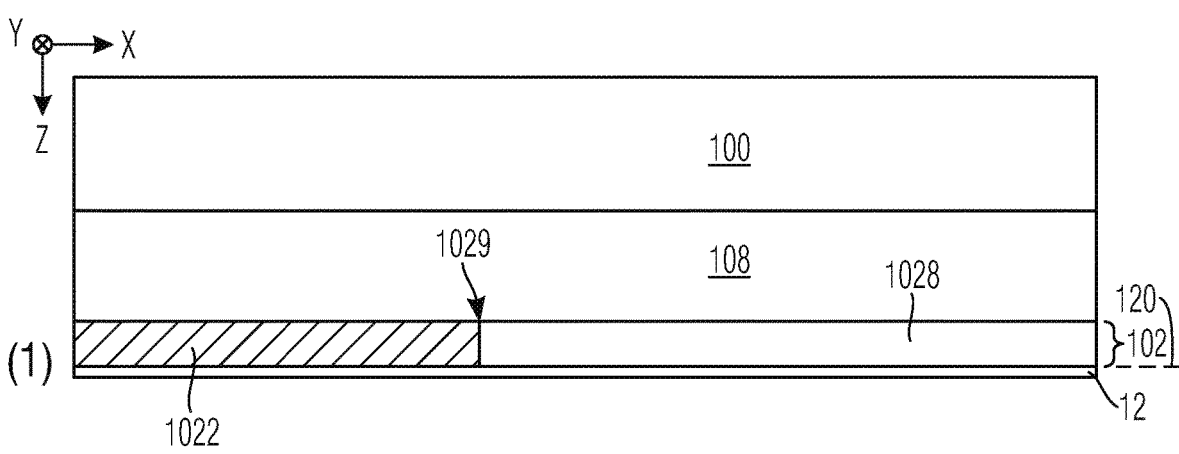
FIG. 4 schematically and exemplarily illustrates a section of a vertical cross-section of a power semiconductor device in accordance with some embodiments.
Figure 4:
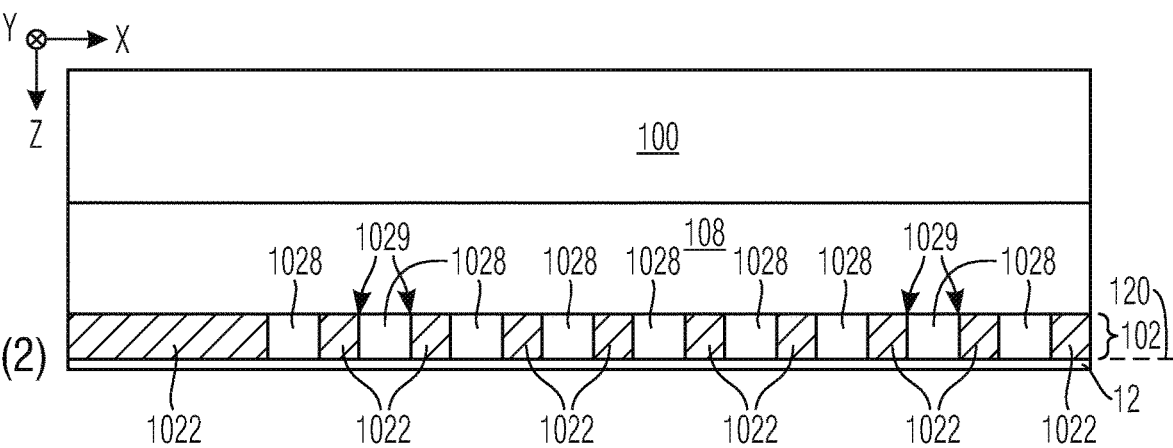
Figure 4:
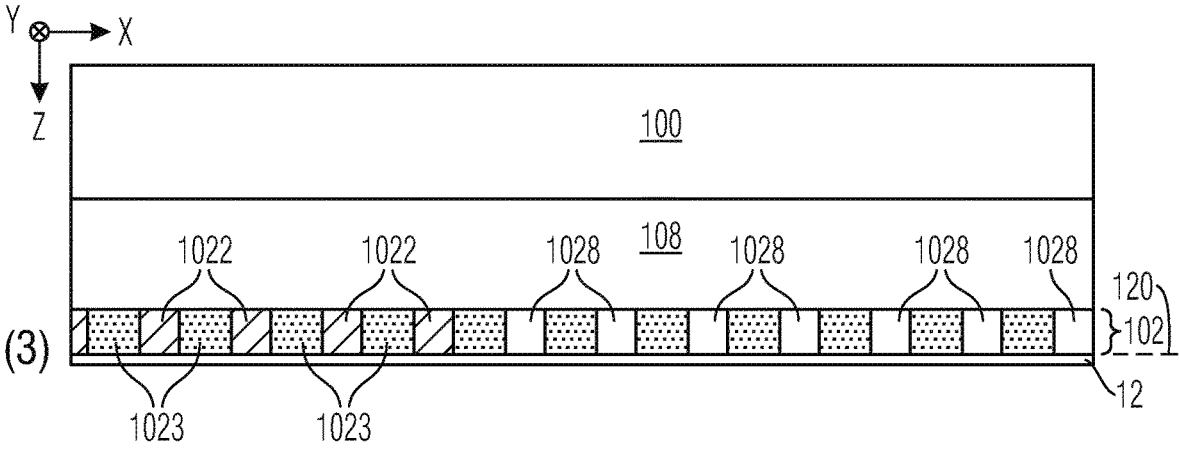

As mentioned above, the electrically activated region 102 may not only be formed at the frontside 110, but additionally or alternatively at the backside 120. Some examples in this respect are now described with reference to FIG. 4:

FIG. 4 illustrates three examples (1) to (3) of a configuration of a lower portion of a semiconductor body 10 belonging, e.g., to an IGBT or RC IGBT.

For example, referring to all three examples, the drift region 100 of the first conductivity type extends along the vertical direction Z until adjoining a field stop region 108 of the first conductivity type. The field stop region 108 exhibits a higher dopant concentration than the drift region 100 and adjoins an emitter structure that is electrically connected to the second load terminal 12 (e.g., a collector terminal). In accordance with the three examples (1) to (3), the electrically activated region 102 forms the backside emitter structure of an IGBT/RC IGBT. For example, the change region 1029 separates the backside emitter structure into locally enhanced backside emitter (LEBE) portion 1022 and a "regular" emitter portion 1028. Such separation may be provided once (example (1)) or several times (examples (2) and (3)), e.g., based on correspondingly configuring the mask layer 210 with first and second mask sections 211 and 212. In view of the aforesaid, the mask layer 210 may also be provided with third section 213 different from both the first and second mask sections 211 and 212 to form further emitter portions 1023 having a yet different dopant concentration than the LEBE portions 1022 and the regular portions 1028.

In accordance with embodiments described above, it is possible to provide a doped region with little vertical extension and minimal lateral diffusion and, additionally, adjacent thereto, a further doped region with also little, but different vertical extension and minimal lateral diffusion and a different concentration of electrically activated dopants. Such concepts may in particular be applied for semiconductor regions that are electrically connected to a terminal of the power semiconductor device. For example, it may be ensured that a lateral diffusion of (e.g., implanted) dopants of a doped region into critical adjacent regions, such as a channel region, is avoided. The produced region having the laterally varying dopant concentration profile may also be configured to form a recombination zone of the power semiconductor device In the above, embodiments pertaining to a power semiconductor device and corresponding production methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed. For example, the above-described values of the dopant concentrations and dopant doses are related to embodiments where Si is chosen as the material of the semiconductor body 10.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

For example, for embodiments where SiC is chosen as the material of the semiconductor body 10, the above-described values of the dopant concentrations and dopant doses may need to be adapted. For example, in case of SiC, the dopant concentrations are increased by a factor of ten or a factor of 100, and the dopant doses are increased by a factor between three and ten, compared to the values of the doses and concentrations described above.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a laterally varying dopant concentration profile of an electrically activated dopant in a power semiconductor device, the method comprising:
  providing a semiconductor body;
  implanting a dopant to form a doped region in the semiconductor body;
  providing, above the doped region, a mask layer having a first section and a second section, wherein the first section has a first thickness along a vertical direction and the second section has a second thickness along the vertical direction, wherein the second thickness is different from the first thickness; and
  subjecting each of the doped region, the first section of the mask layer, and the second section of the mask layer to a laser thermal annealing (LTA) processing step.

2. The method of claim 1, wherein the second mask section of the mask layer adjoins the first section of the mask layer.

3. The method of claim 1, wherein the mask layer comprises silicon oxide, silicon nitride, and/or amorphous silicon.

4. The method of claim 1, wherein the first section of the mask layer has a first reflectance different from a second reflectance of the second section of the mask layer.

5. The method of claim 4, wherein the first reflectance is above 50%, and wherein the second reflectance is below 35%.

6. The method of claim 4, wherein the first reflectance and the second reflectance are present at a specific wavelength of a laser light emitted during the LTA processing step.

7. The method of claim 1, wherein a laser light emitted during the LTA processing step has a wavelength in a range of 150 nm to 1100 nm.

8. The method of claim 1, wherein the first thickness and the second thickness are chosen in dependence of a wavelength of a laser light emitted during the LTA processing step.

9. The method of claim 1, wherein the first section of the mask layer acts as a laser light reflector and the second section of the mask layer acts as a laser light absorber, or wherein both the first section of the mask layer and the second section of the mask layer act as laser light absorbers.

10. The method of claim 1, wherein the LTA processing step is carried out to electrically activate the implanted dopant at least partially, thereby forming an electrically activated region in the doped region.

11. The method of claim 10, wherein the electrically activated region has, in a change region corresponding to a vertical projection of a transition between the first section of the mask layer and the second section of the mask layer, a dopant concentration gradient along a first lateral direction of at least $(1*10^{20}$ cm$^{-3}$-$1*10^{17}$ cm$^{-3})/50$ nm.

12

12. The method of claim 1, wherein the implanted dopant includes one of boron-fluorine, boron, gallium, aluminum, nitrogen, arsenic, phosphorus, and antimony.

13. The method of claim 1, wherein the dopant is implanted with an energy in a range of 10 keV to 1000 keV, and/or wherein a maximum concentration of the implanted dopant is situated in a range of 10 nm to 1000 nm.

14. The method of claim 1, further comprising implanting a non-dopant into the doped region.

15. The method of claim 1, wherein forming the mask layer comprises:
  depositing the mask material;
  carrying out a lithographic processing step; and
  carrying out an etch processing step.

16. A method of forming a laterally varying dopant concentration profile of an electrically activated dopant in a power semiconductor device, the method comprising:
  providing a semiconductor body;
  providing, at the semiconductor body, a mask layer having a first section and a second section, wherein the first section has a first thickness along a vertical direction and the second section has a second thickness along the vertical direction, wherein the second thickness is different from the first thickness;
  implanting a dopant to form a doped region in the semiconductor body; and
  subjecting each of the doped region, the first section of the mask layer, and the second section of the mask layer to a laser thermal annealing (LTA) processing step,
  wherein the doped region is a body region of a transistor cell,
  wherein the LTA processing step yields both a channel region and a body contact subregion in the body region,
  wherein the body contact subregion has a higher dopant concentration than the channel region and is displaced from the channel region based on the laterally varying dopant concentration profile.

17. The method of claim 16, wherein the mask layer comprises silicon oxide, silicon nitride, and/or amorphous silicon.

18. The method of claim 16, wherein the first section of the mask layer has a first reflectance different from a second reflectance of the second section of the mask layer.

19. The method of claim 18, wherein the first reflectance is above 50%, and the second reflectance is below 35%.

20. The method of claim 18, wherein the first reflectance and the second reflectance are present at a specific wavelength of a laser light emitted during the LTA processing step.

21. The method of claim 16, wherein a laser light emitted during the LTA processing step has a wavelength in a range of 150 nm to 1100 nm.

22. The method of claim 16, wherein the first thickness and the second thickness are chosen in dependence of a wavelength of a laser light emitted during the LTA processing step.

23. The method of claim 16, wherein the first section of the mask layer acts as a laser light reflector and the second section of the mask layer acts as a laser light absorber, or wherein both the first section of the mask layer and the second section of the mask layer act as laser light absorbers.

24. The method of claim 16, wherein the LTA processing step is carried out to electrically activate the implanted dopant at least partially, thereby forming an electrically activated region in the doped region.

25. The method of claim 24, wherein the electrically activated region has, in a change region corresponding to a vertical projection of the transition between the first section of the mask layer and the second section of the mask layer, a dopant concentration gradient along a first lateral direction of at least $(1*10^{20}$ cm$^{-3}$-$1*10^{17}$ cm$^{-3})/50$ nm.

26. The method of claim 16, wherein the implanted dopant includes one of boron-fluorine, boron, gallium, aluminum, nitrogen, arsenic, phosphorus, and antimony.

27. The method of claim 16, wherein the dopant is implanted with an energy in a range of 10 keV to 1000 keV, and/or wherein a maximum concentration of the implanted dopant is situated in a range of 10 nm to 1000 nm.

28. The method of claim 16, further comprising implanting a non-dopant into the doped region.

29. The method of claim 16, wherein forming the mask layer comprises:

depositing the mask material;

carrying out a lithographic processing step; and carrying out an etch processing step.

30. The method of claim 1, wherein upon completion of the LTA processing step, a first portion of the doped region is electrically activated and a second portion directly adjacent to the first portion is not electrically activated or electrically activated to a lesser extent than the first portion.

31. The method of claim 1, wherein the doped region is a body region of a transistor cell, wherein the LTA processing step yields both a channel region and a body contact subregion in the body region, and wherein the body contact subregion has a higher dopant concentration than the channel region and is displaced from the channel region based on the laterally varying dopant concentration profile.

32. The method of claim 31, wherein a dopant concentration of the body contact subregion is greater than $2*10^{18}$ cm$^{-3}$, and wherein the channel region has a maximum dopant concentration in a range of $1*10^{17}$ cm$^{-3}$ to $1*10^{18}$ cm$^{-3}$.

33. The method of claim 16, wherein upon completion of the LTA processing step, a first portion of the doped region is electrically activated and a second portion directly adjacent to the first portion is not electrically activated or electrically activated to a lesser extent than the first portion.

34. The method of claim 16, wherein a dopant concentration of the body contact subregion is greater than $2*10^{18}$ cm$^{-3}$, and wherein the channel region has a maximum dopant concentration in a range of $1*10^{17}$ cm$^{-3}$ to $1*10^{18}$ cm$^{-3}$.

* * * * *